(12) United States Patent
Banerjee et al.

(10) Patent No.: US 9,473,078 B2
(45) Date of Patent: Oct. 18, 2016

(54) TUNABLE POWER AMPLIFIER WITH WIDE FREQUENCY RANGE

(71) Applicant: Texas Instruments Incorporated, Dallas, TX (US)

(72) Inventors: Aritra Banerjee, Dallas, TX (US); Nathan R. Schemm, Rowlett, TX (US); Rahmi Hezar, Allen, TX (US); Lei Ding, Plano, TX (US); Baher Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 36 days.

(21) Appl. No.: 14/452,365

(22) Filed: Aug. 5, 2014

(65) Prior Publication Data
US 2016/0043698 A1  Feb. 11, 2016

(51) Int. Cl.
*H03F 3/191* (2006.01)
*H03F 1/42* (2006.01)
*H03F 1/02* (2006.01)
(Continued)

(52) U.S. Cl.
CPC . *H03F 1/42* (2013.01); *B81B 7/02* (2013.01); *H03F 1/0205* (2013.01); *H03F 1/0294* (2013.01); *H03F 1/223* (2013.01); *H03F 1/565* (2013.01); *H03F 3/19* (2013.01); *H03F 3/193* (2013.01); *H03F 3/195* (2013.01); *H03F 3/21* (2013.01); *H03F 3/211* (2013.01); *H03F 3/245* (2013.01); *B81B 2207/99* (2013.01); *H03F 2200/111* (2013.01); *H03F 2200/378* (2013.01); *H03F 2200/391* (2013.01); *H03F 2200/451* (2013.01); *H03F 2200/537* (2013.01); *H03F 2200/541* (2013.01); *H03F 2200/546* (2013.01); *H03F 2203/21157* (2013.01)

(58) Field of Classification Search
CPC ..... H03F 3/191; H03F 3/14; H03F 2200/546
USPC ......................................... 330/302, 305, 307
See application file for complete search history.

(56) References Cited

U.S. PATENT DOCUMENTS

| 8,502,608 B2* | 8/2013 | Brobston ............... H03F 1/565 330/302 |
| 2004/0214543 A1* | 10/2004 | Osone ..................... H01G 5/16 455/197.2 |

OTHER PUBLICATIONS

Fabbro et al. "RF power amplifier employing a frequency-tunable impedance matching network based on coupled inductors", Electronics Letters, vol. 44, No. 19, Sep. 11, 2008, 2 pages.
(Continued)

*Primary Examiner* — Steven J Mottola
(74) *Attorney, Agent, or Firm* — John R. Pessetto; Charles A. Brill; Frank D. Cimino

(57) ABSTRACT

A circuit includes an amplifier configured to amplify an input signal and generate an output signal. The circuit also includes a tuning network configured to tune frequency response of the amplifier. The tuning network includes at least one tunable capacitor, where the at least one tunable capacitor includes at least one micro-electro mechanical system (MEMS) capacitor. The amplifier could include a first die, the at least one MEMS capacitor could include a second die, and the first die and the second die could be integrated in a single package. The at least one MEMS capacitor could include a MEMS superstructure disposed over a control structure, where the control structure is configured to control the MEMS superstructure and tune the capacitance of the at least one MEMS capacitor.

5 Claims, 7 Drawing Sheets

(51) Int. Cl.

| | |
|---|---|
| *H03F 3/19* | (2006.01) |
| *H03F 3/21* | (2006.01) |
| *B81B 7/02* | (2006.01) |
| *H03F 1/22* | (2006.01) |
| *H03F 3/195* | (2006.01) |
| *H03F 3/24* | (2006.01) |
| *H03F 1/56* | (2006.01) |
| *H03F 3/193* | (2006.01) |

(56) References Cited

OTHER PUBLICATIONS

Zhang et al. "Broad-Band Power Amplifier With a Novel Tunable Output Matching Network", IEEE Transactions on Microwave Theory and Techniques, vol. 53, No. 11, Nov. 2005, pp. 3606-3614.
All et al. "Tunable Multiband Power Amplifier Using Thin-Film BST Varactors for 4G Handheld Applications", IEEE 2010, pp. 236-239.
F.H. Raab "Idealized Operation of the Class E Tuned Power Amplifier", IEEE Transactions on Circuits and Systems, vol. CAS-24, No. 12, Dec. 1977, pp. 795-735.

* cited by examiner

TUNABLE POWER AMPLIFIER WITH WIDE FREQUENCY RANGE

TECHNICAL FIELD

This disclosure is generally directed to radio frequency (RF) power amplifiers. More specifically, this disclosure is directed to a tunable power amplifier with a wide frequency range.

BACKGROUND

A radio frequency (RF) power amplifier and its matching network are typically designed for operation at a fixed carrier frequency. At other carrier frequencies, the power amplifier often loses performance, including efficiency, output power, and linearity. For example, if a power amplifier loses linearity, it cannot satisfy its spectral mask requirements, and pre-distortion is often needed, which in turn is more complicated, consumes more power, and occupies more die area.

For modern wireless communication systems where the frequency range of interest is very wide, multiple power amplifiers may be needed to cover different frequency bands within the frequency range of interest. Unfortunately, using multiple power amplifiers can incur significant increases in cost, complexity, power consumption and die area. Having a single tunable power amplifier that can cover multiple frequency bands is a more attractive solution for these applications.

SUMMARY

This disclosure provides a tunable power amplifier that covers a wide frequency range.

In one example, a circuit includes an amplifier configured to amplify an input signal and generate an output signal. The circuit also includes a tuning network configured to tune the frequency response of the amplifier. The tuning network includes at least one tunable capacitor, where the at least one tunable capacitor includes at least one micro-electro mechanical system (MEMS) capacitor.

In another example, a method includes amplifying an input signal and generating an output signal using an amplifier. The method also includes tuning frequency response of the amplifier using a tuning network coupled to the amplifier. The tuning network includes at least one tunable capacitor, and the at least one tunable capacitor includes a micro-electro mechanical system (MEMS) capacitor.

In a third example, a system includes an amplifier having multiple power amplifiers. The system also includes a tuning network having (i) multiple inductors each coupled to one of the power amplifiers and (ii) multiple tunable capacitors coupled to the inductors. Each tunable capacitor includes at least one micro-electro mechanical system (MEMS) capacitor.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 11, discussed below, and the various examples used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

As noted above, a radio frequency (RF) power amplifier and its matching network are typically designed for operation at a fixed carrier frequency. Operations at other carrier frequencies or over a frequency range of interest can be problematic for conventional RF power amplifiers. In accordance with this disclosure, a power amplifier is provided on or over a die (such as a complementary metal-oxide-semiconductor or "CMOS" die) and integrated with tunable capacitors (such as micro-electro mechanical system or "MEMS" capacitors) and inductors in the same package. The MEMS capacitors are used to achieve higher amplifier performance and may be based on the DIGITAL LIGHT PROCESSING (DLP) technology from TEXAS INSTRUMENTS INC. of Dallas, Tex.

Figure 1:
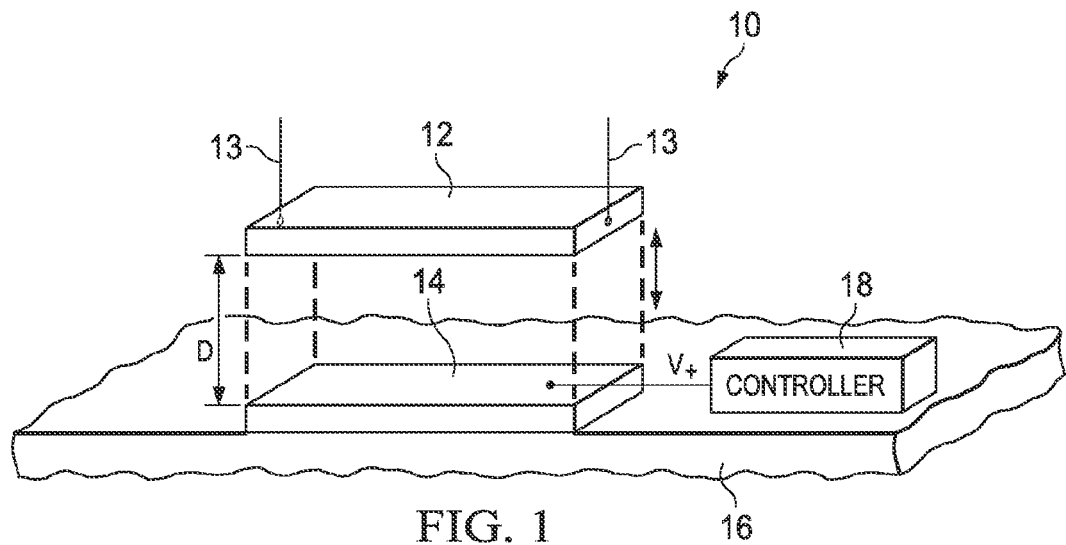
FIG. 1 illustrates an example digital light processing (DLP) micro-electro mechanical system (MEMS) tunable capacitor.

FIG. 1 illustrates an example DLP MEMS tunable capacitor 10. As shown in FIG. 1, the tunable capacitor 10 includes a superstructure having at least one deflectable metallic membrane 12. Hinges 13 hinge the membrane 12 over an underlying control section, which includes at least one electrode 14 formed over a substrate 16. A space D between the membrane 12 and the electrode 14 forms a dielectric. A control voltage V+ provided to the electrode 14 by a controller 18 creates an electrostatic force on the membrane 12 that controllably varies the distance D between the membrane 12 and the electrode 14 to establish a variable capacitance. Each tunable capacitor 10 has two states, a high capacitance state (minimum distance D between membrane 12 and electrode 14) and a low capacitance state (maximum distance D between membrane 12 and electrode 14). Thus, the capacitors 10 are bi-stable. Multiple capacitors 10 combined together, such as in an array, provide a wide tunable capacitance range that is obtained by controlling the states of multiple capacitors 10. A voltage may also or alternatively be provided to the membrane 12 to create the electrostatic force. The membrane 12 can be substantially planar and substantially parallel to the electrode 14 and move vertically to vary the distance D and thus the capacitance.

As described in more detail below, one or multiple MEMS capacitors 10 are used in a power amplifier's tuning network. This is beneficial since MEMS capacitors provide high RF power handling capability, wide tuning ranges, and good RF performances such as high quality factor, small insertion loss and high linearity compared to varactor diodes or ordinary switched capacitor banks. MEMS capacitors can also be used in smaller packages. As particular examples, a tunable MEMS capacitor (array of MEMS capacitors 10) may have a tolerance of 0.1 pF, a Q>100 at 1 GHz, and a Q>50 at 2 GHz, and the linearity may be IIP3>75 dBm. These values can help to achieve superior performance of a power amplifier at these frequencies. For example, if the variable capacitor has a high insertion loss, then the power amplifier loses output power and efficiency degrades.

In some implementations, the controller 18 provides digital levels of the control voltage V+ to individual MEMS capacitor 10 of a tunable capacitor array so that the capacitance can be set in steps. For example, in some implementations, the capacitance of a tunable MEMS capacitor array can be programmed and digitally tuned in 0.17 pF steps and have a range of 1 pF to 6.5 pF. Note, however, that other values and ranges can be provided as desired.

Figure 2A:
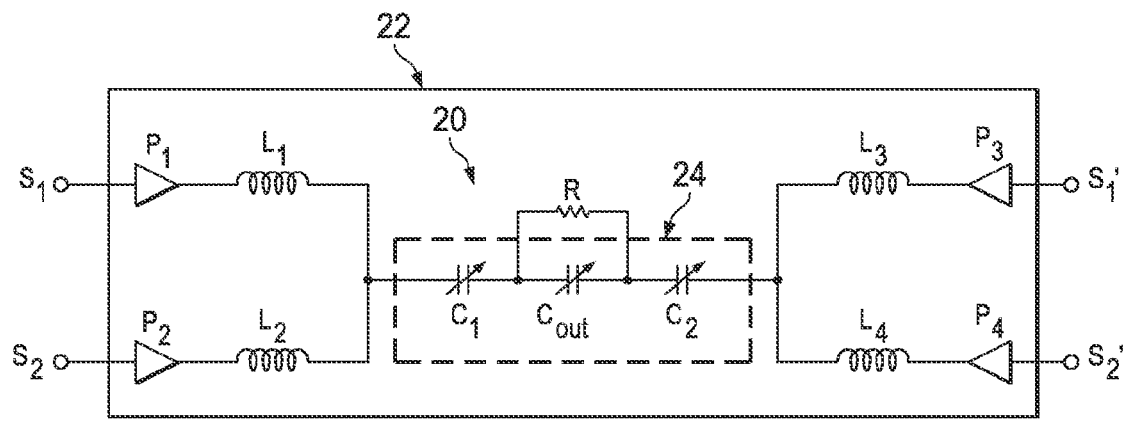
FIGS. 2A and 2B illustrate an example tunable power amplifier in accordance with this disclosure.

FIG. 2A illustrates an example tunable power amplifier 20 in accordance with this disclosure. In this particular example, the tunable power amplifier 20 represents a tunable outphasing or LINC (Linear Amplification with Nonlinear Components) power amplifier, which could be formed at least partially on a CMOS die 22 or other semiconductor die. The tunable power amplifier 20 could have any suitable operating frequency range. For instance, the tunable power amplifier 20 could represent a tunable outphasing power amplifier with an operating frequency range from 1.5 GHz to 2.7 GHz.

As shown in FIG. 2A, the tunable power amplifier 20 includes amplifier sections comprising four power amplifiers $P_1$-$P_4$, four inductors $L_1$-$L_4$, three tunable capacitors $C_1$-$C_2$ and $C_{out}$, and a load resistor R. The tunable capacitors $C_1$-$C_2$ and $C_{out}$, along with inductors $L_1$-$L_4$, form a tuning network 24 for the power amplifier. A first differential outphasing input signal $S_1/S_1'$ is coupled to the power amplifiers $P_1$ and $P_3$, and a second differential outphasing input signal $S_2/S_2'$ is coupled to power amplifiers $P_2$ and $P_4$.

Each of the power amplifiers $P_1$-$P_4$ represents any suitable type(s) of switching power amplifier(s), such as a class-D or class-E amplifier. Each of the inductors $L_1$-$L_4$ represents any suitable inductive structure having any suitable inductance. In some implementations, the inductors $L_1$-$L_4$ have substantially equal inductances. Each of the tunable capacitors $C_1$-$C_2$ and $C_{out}$ represents any suitable tunable capacitor(s), such as multiple MEMS capacitors 10 configured in parallel or other arrangement. In some implementations, the capacitors $C_1$-$C_2$ are tuned to have substantially equal capacitances. Note that each MEMS capacitor array forming the tunable capacitors $C_1$-$C_2$ and $C_{out}$ could have its own controller 18, or multiple MEMS capacitor arrays forming the tunable capacitors $C_1$-$C_2$ and $C_{out}$ could share a common controller 18. The load resistor R represents any suitable resistive structure having any suitable resistance.

Figure 2B:
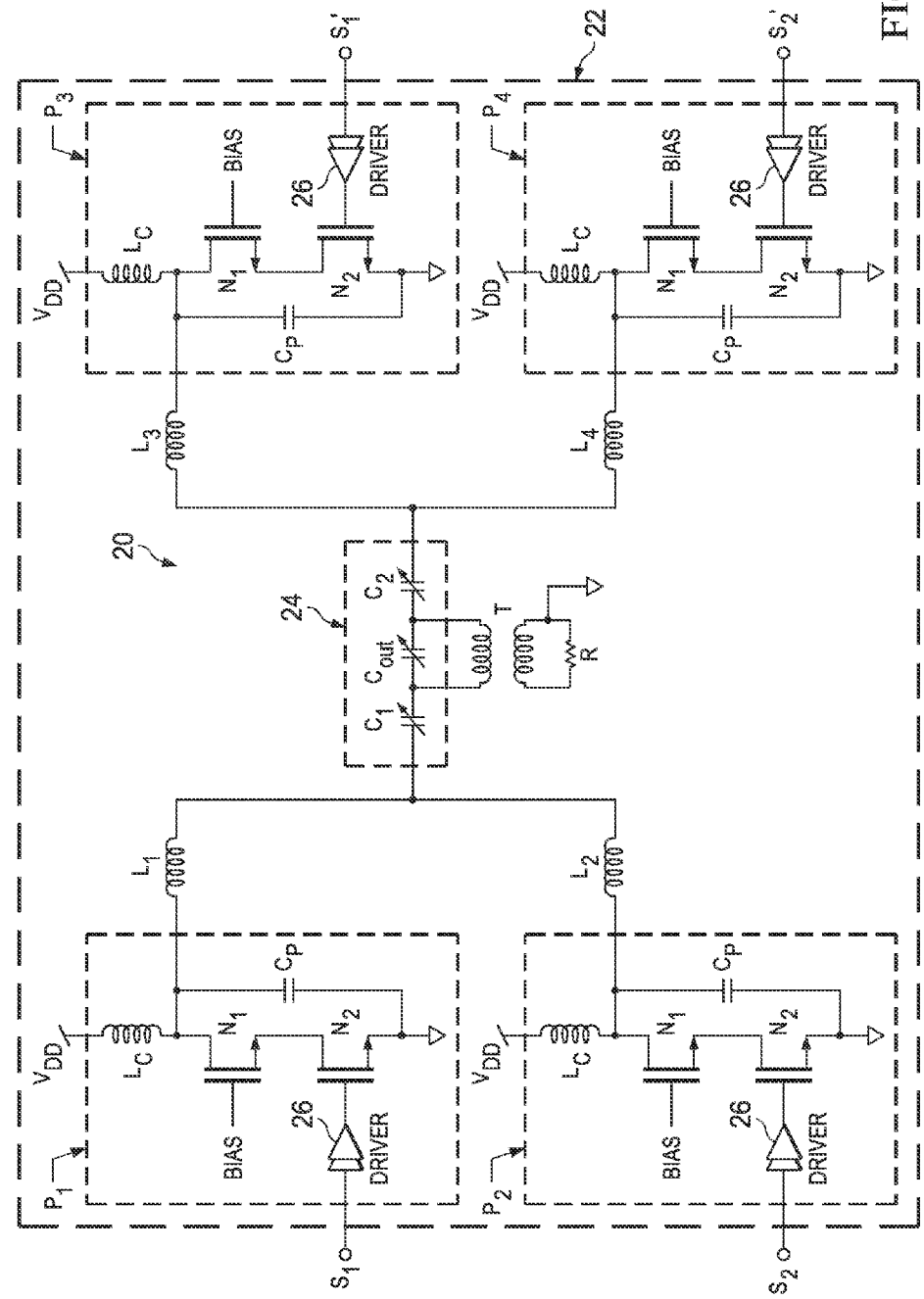

FIG. 2B shows an example schematic of a frequency-tunable wideband class-E outphasing power amplifier 20. Simulation results obtained from this design are shown in FIGS. 3-10. Each class-E power amplifier $P_1$-$P_4$ consists of a core switching device (NMOS transistor $N_2$) that is driven by the outphasing waveform through a driver chain 26, a high voltage cascode NMOS transistor ($N_1$) biased properly, which can sustain higher voltage stress and is used here to obtain higher peak output power from the outphasing power amplifier 20, a capacitor $C_P$ (in this design no external capacitor is used, the output capacitance of the power amplifier $P_1$-$P_4$ is used as $C_P$), and an inductor $L_C$ which connects the power amplifiers $P_1$-$P_4$ to the power supply $V_{DD}$. Inductors $L_1$-$L_4$ and capacitors $C_1$ and $C_2$ are tuned for class-E operation. Capacitor $C_{out}$ is the output capacitor connected to load resistance R through a balun T. Capacitors $C_1$-$C_2$ and $C_{out}$ are built using tunable MEMS capacitors. The capacitors $C_1$-$C_2$ and $C_{out}$ and inductors $L_1$-$L_4$ form the outphasing combiner as well as the matching network.

In addition, LC circuits tuned to specific harmonic frequencies can be connected between the drains of the cascode transistors $N_1$ of differential sides for waveform shaping, and those capacitors are also built using MEMS and can be tuned over wide frequency range of interest. Inductors or capacitors can be connected between the drains of the cascode transistors $N_1$ of $S_1$ and $S_2$ sides for improving back-off efficiency.

FIGS. 3 through 10 illustrate example operational and other details regarding high-power and low-power implementations of the tunable power amplifier 20 in accordance with this disclosure. More specifically, FIGS. 3 through 6 illustrate example operational and other details regarding the high-power implementation of the tunable power amplifier 20, and FIGS. 7 through 10 illustrate example operational and other details regarding the low-power implementation of the tunable power amplifier 20. The tunable capacitors $C_1$-$C_2$ and $C_{out}$ have a higher capacitance range (tuning range) in the high-power implementation of the power amplifier 20 than in the low-power implementation of the power amplifier 20. Both implementations of the power amplifier 20 cover the frequency range from about 1.5 GHz to about 2.7 GHz in the examples shown, although other frequency ranges could be used.

Figure 3:
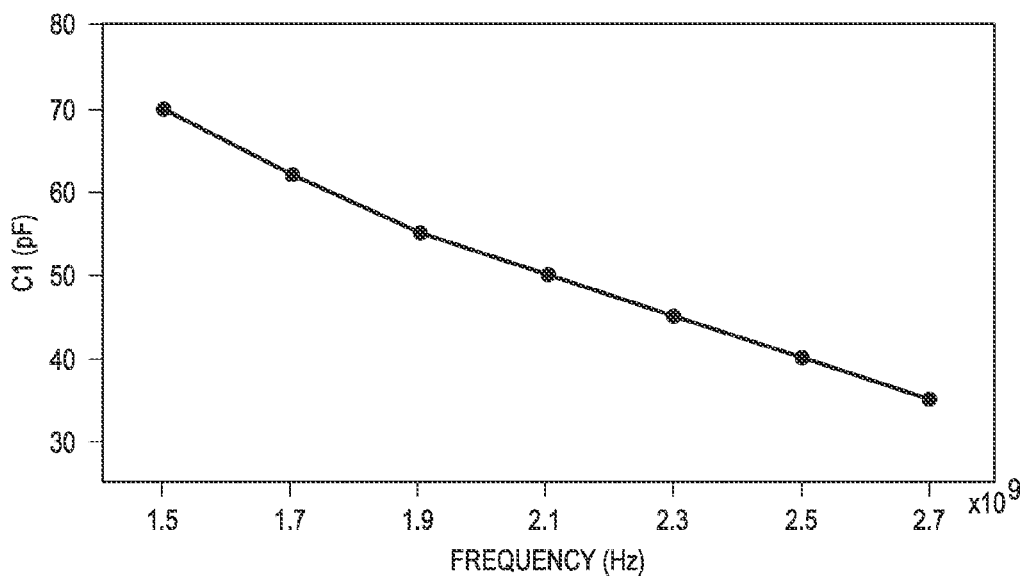
FIGS. 3 through 10 illustrate example operational and other details regarding high-power and low-power implementations of the tunable power amplifier in accordance with this disclosure.
Figure 4:
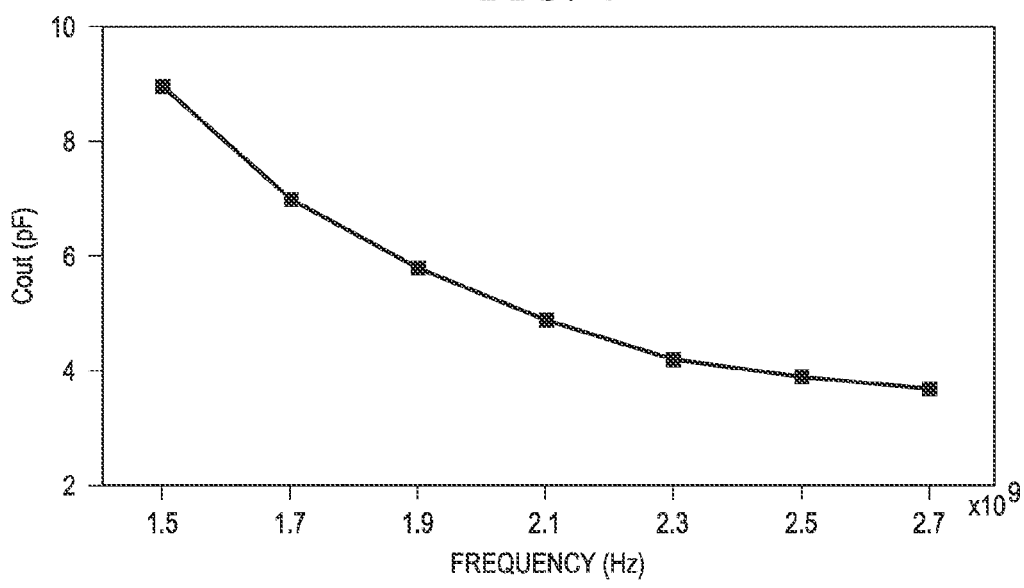

Parameters and results of the high-power implementation of the power amplifier 20 are shown in FIGS. 3 through 6. FIG. 3 shows the values of the tunable MEMS capacitors $C_1$-$C_2$ as a function of the tuned frequency of the power amplifier 20. The value of each MEMS capacitor $C_1$-$C_2$ is programmable between 35 pF and 70 pF. FIG. 4 shows the values of the MEMS capacitor $C_{out}$ as a function of the tuned frequency of the power amplifier 20, where the value of the MEMS capacitor $C_{out}$ is programmable between 3.7 pF and 9 pF.

Figure 5:
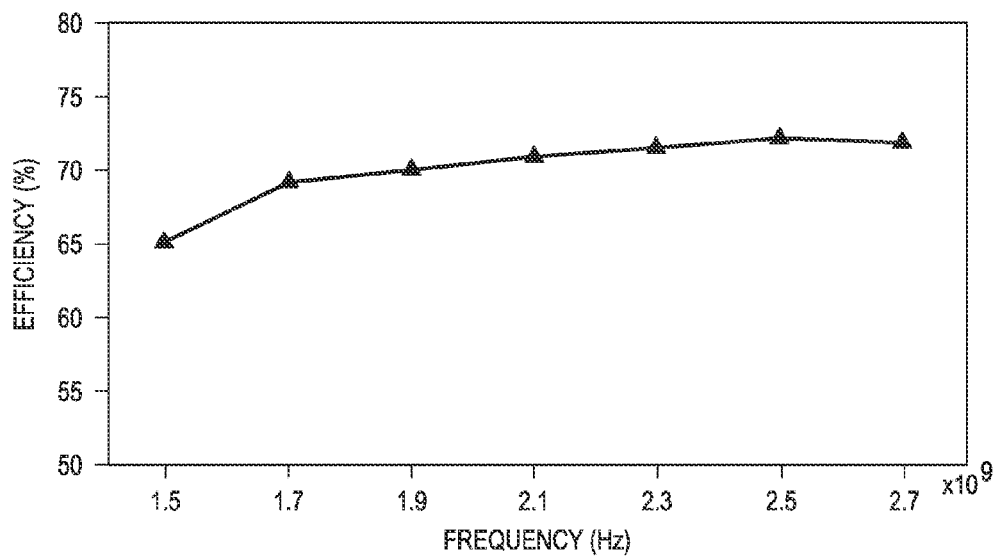
Figure 6:
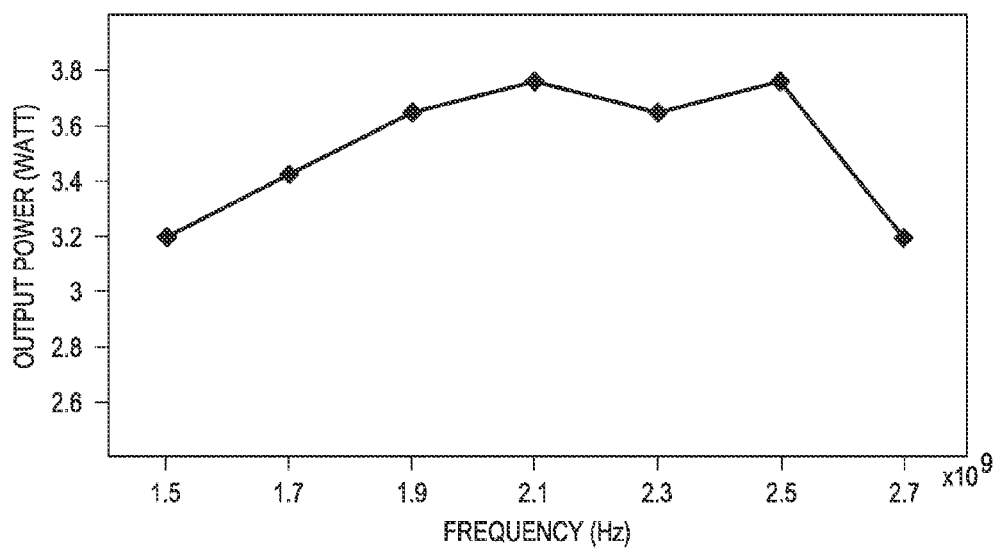

FIG. 5 shows the efficiency of the power amplifier 20 as a function of frequency, where the efficiency is relatively high and consistent over the frequency range. FIG. 6 shows the output power of the power amplifier 20 as a function of frequency, which again is relatively high and consistent over the frequency range.

Figure 7:
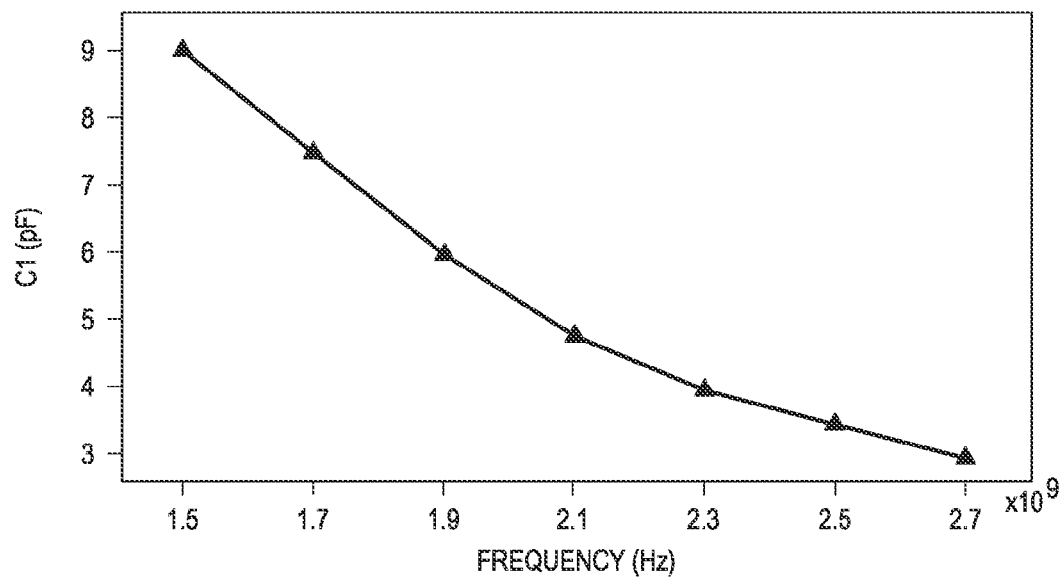
Figure 8:
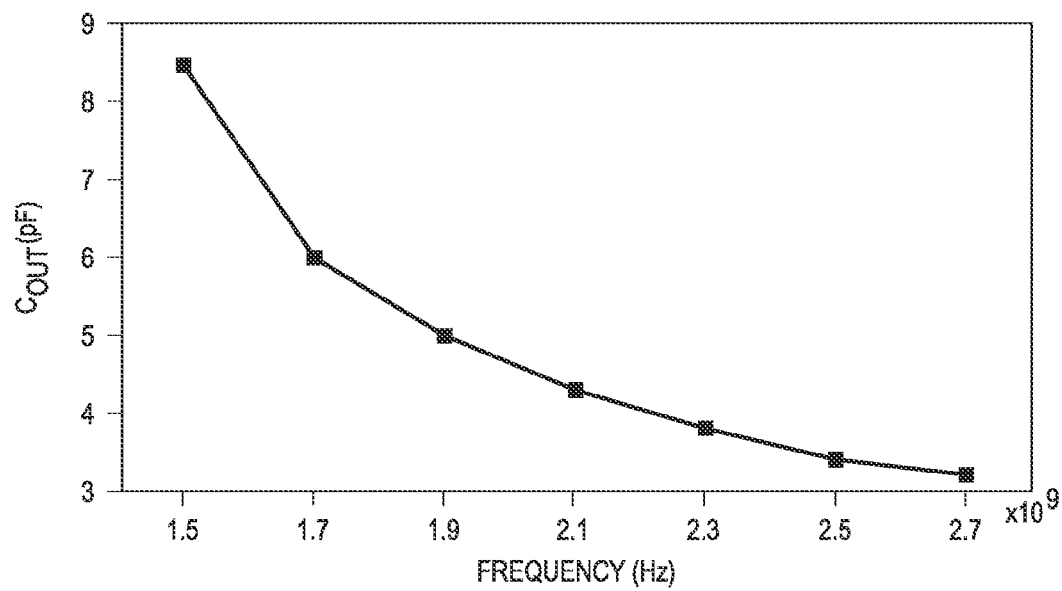

Parameters and results of the low-power implementation of the power amplifier 20 are shown in FIGS. 7 through 10. FIG. 7 shows the values of the tunable MEMS capacitors $C_1$-$C_2$ as a function of the tuned frequency of the power amplifier 20. The value of each MEMS capacitor $C_1$-$C_2$ is programmable between 3 pF and 9 pF. FIG. 8 shows the values of the MEMS capacitor $C_{out}$ as a function of the tuned frequency of the power amplifier 20, where the value of the MEMS capacitor $C_{out}$ is programmable between 3.2 pF to 8.5 pF.

Figure 9:
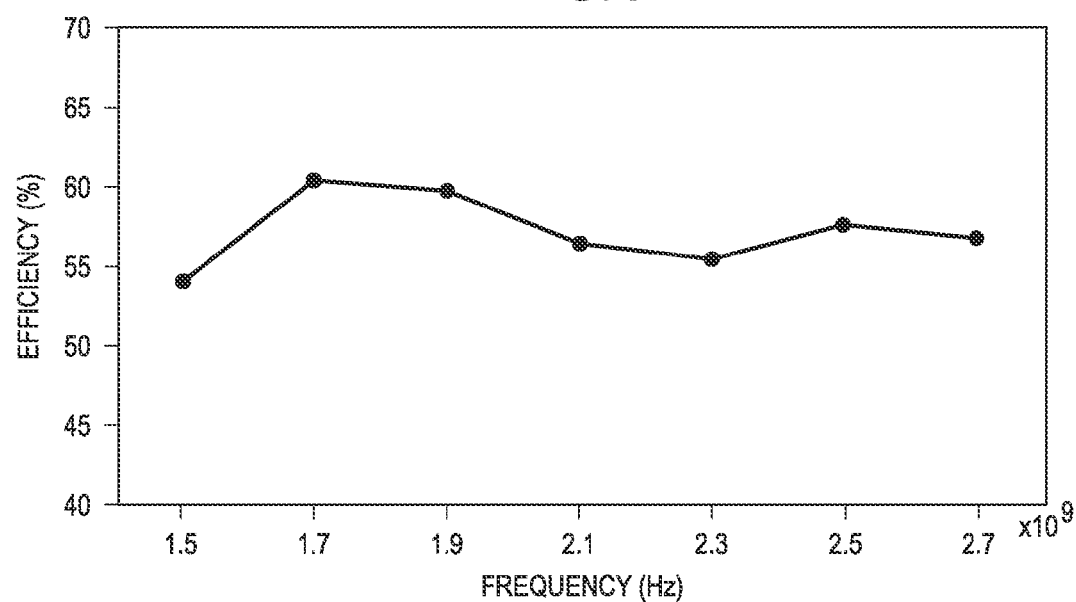
Figure 10:
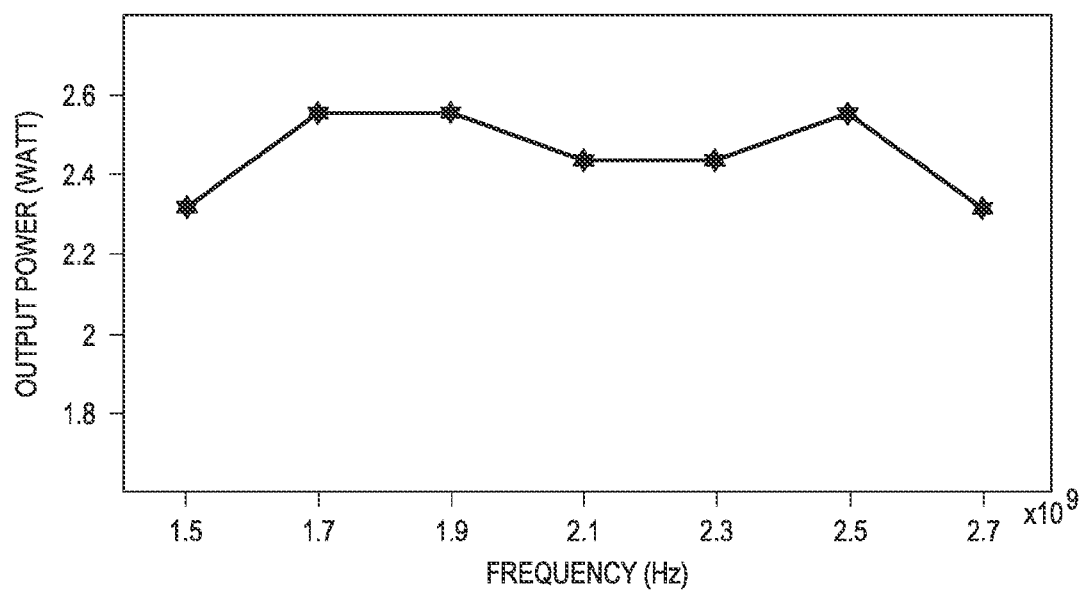

FIG. 9 shows the efficiency of the power amplifier 20 as a function of frequency, where the efficiency is relatively consistent over the frequency range. FIG. 10 shows the output power of the power amplifier 20 as a function of frequency, which is relatively consistent over the frequency range.

Figure 11:
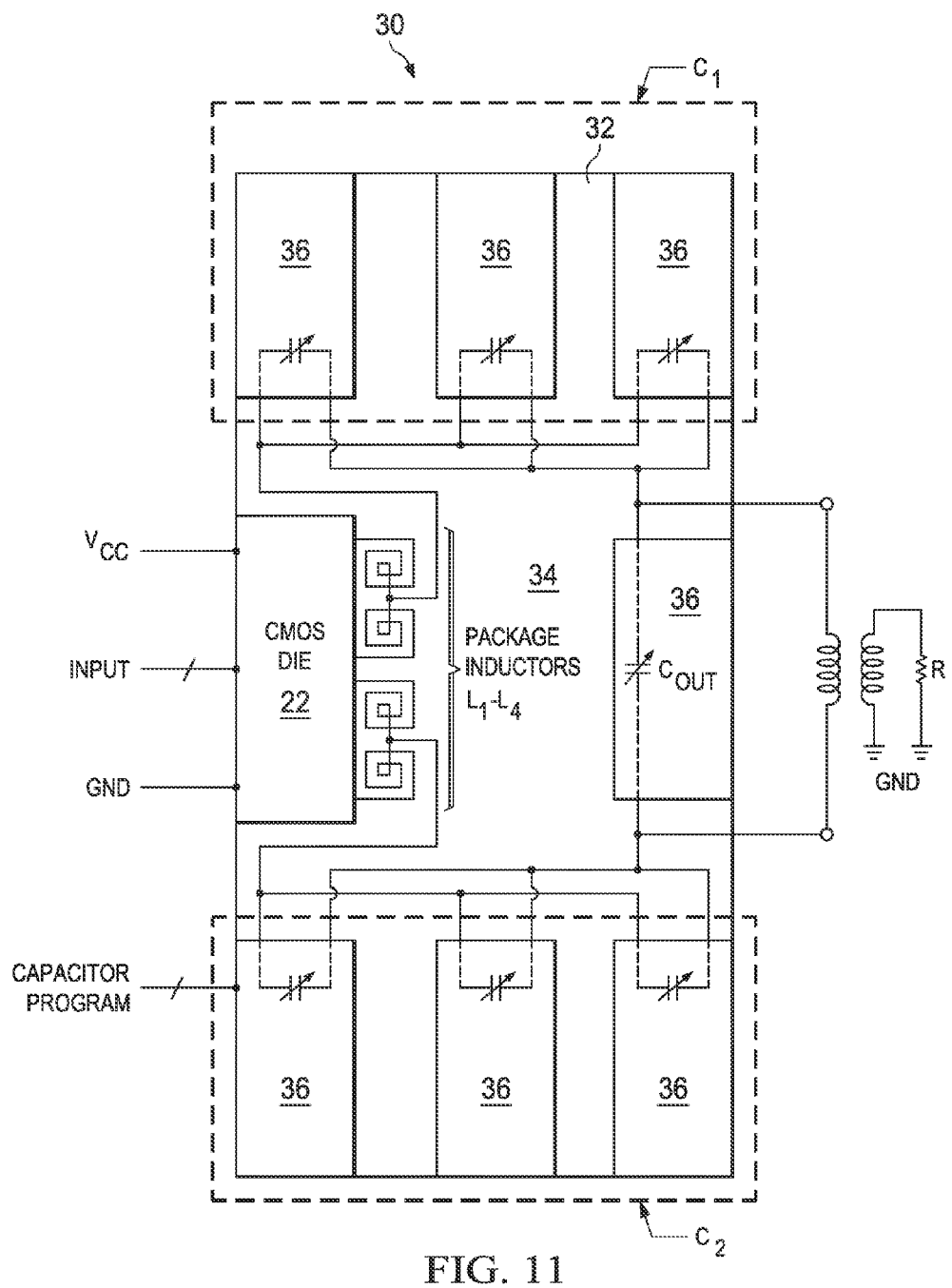
FIG. 11 illustrates an example of a tunable power amplifier in a package in accordance with this disclosure.

FIG. 11 illustrates an example of a tunable power amplifier in a package 30 in accordance with this disclosure. The package 30 includes a substrate 32 with the CMOS die 22 positioned on an upper surface 34 of the substrate 32. The CMOS die 22 includes the power amplifiers $P_1$-$P_4$ shown in FIG. 2. The package 30 also includes the inductors $L_1$-$L_4$ positioned proximate the CMOS die 22. The inductors $L_1$-$L_4$ are designed as spiral inductors using the metal layers of the package 30. One inductor $L_1$-$L_4$ is provided for each power amplifier $P_1$-$P_4$, respectively, as shown in FIG. 2.

Multiple MEMS modules 36 form each capacitor $C_1$-$C_2$, and one MEMS module 36 forms the capacitor $C_{out}$. Each MEMS module 36 could include three tunable MEMS capacitor banks coupled in parallel. The MEMS modules 36 forming each capacitor $C_1$-$C_2$ are coupled in parallel so that all nine MEMS capacitor banks are coupled in parallel. Note, however, that the number of MEMS modules 36 and the number of MEMS capacitor banks in each MEMS module 36 are for illustration only. Each MEMS module 36 can include a semiconductor die that is separate from the die 22.

In the illustrated example, the MEMS modules 36 are positioned on the upper surface 34 of the substrate 32 and are radially positioned around the CMOS die 22. A controller 18 may be provided for each MEMS module 36 to control the capacitance of that MEMS module 36, or a controller 18 could be provided in the package 30 to control the capacitance of multiple MEMS modules 36. In any case, each of the MEMS modules 36 can be digitally programmed by remote control signals provided to the package 30.

The capacitor $C_{out}$ is positioned at a central portion of the package 30 between the two capacitors $C_1$-$C_2$, which are positioned at opposing ends of the package 30. The interconnects between the CMOS die 22, the inductors $L_1$-$L_4$, and the MEMS modules 36 can be formed by strip lines as the package 30 may operate at frequencies over 1 GHz. The CMOS die 22 is positioned in a central portion of the substrate 32 to help reduce or minimize distance, and thus associated parasitics, introduced by the interconnects between the CMOS die 22 and the tuning network formed by the inductors $L_1$-$L_4$ and the tunable capacitors $C_1$-$C_2$ and $C_{out}$. Input terminals of the power amplifier 20 can be formed proximate the CMOS die 22 to reduce or minimize parasitics. The external control signals that program the capacitors $C_1$-$C_2$ and $C_{out}$ may be provided at any location on the package 30.

In this example, three MEMS modules 36 form each MEMS capacitor $C_1$-$C_2$, and one MEMS module 36 forms the MEMS capacitor $C_{out}$. Each MEMS capacitor $C_1$-$C_2$ is programmable, such as between 9 pF and 58.5 pF, and the MEMS capacitor $C_{out}$ is programmable, such as between 3 pF and 19.5 pF. Note, however, that other values could also be supported. Also, in other embodiments, more or fewer MEMS modules 36 may be used to form the programmable MEMS capacitors $C_1$-$C_2$ and $C_{out}$ of the power amplifier 20, where more MEMS modules 36 are used to create MEMS capacitors having a greater capacitance tuning range.

Although FIGS. 1 through 11 illustrate examples of tunable power amplifiers that are operable over a wide range of frequencies, various changes may be made to FIGS. 1 through 11. For example, the tunable power amplifier 20 could include any other suitable arrangement of power amplifiers, inductors, capacitors, and resistors. The power amplifiers could comprise of other types, such as pulse width modulated (PWM) power amplifier, linear power amplifiers etc and suitable tunable matching networks can be designed accordingly. Also, each tunable capacitor $C_1$-$C_2$ and $C_{out}$ could be implemented using any number of MEMS capacitors, including a single MEMS capacitor or multiple MEMS capacitors placed in any suitable arrangement. In addition, the values shown in the graphs in FIGS. 3-10 are examples only. Other embodiments of the tunable power amplifier 20 could have any other suitable operational characteristics.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed:

1. A circuit comprising:
an amplifier configured to amplify an input signal and generate an output signal; and
a tuning network configured to tune frequency response of the amplifier, the tuning network comprising at least one tunable capacitor, wherein the at least one tunable capacitor comprises at least one micro-electro mechanical system (MEMS) capacitor;
wherein:
the amplifier comprises a first die;
the at least one MEMS capacitor comprises a second die; and
the first die and the second die are integrated in a single package;
wherein the at least one MEMS capacitor comprises multiple MEMS capacitors disposed along multiple sides of the amplifier.

2. A circuit comprising:
an amplifier configured to amplify an input signal and generate an output signal; and
a tuning network configured to tune frequency response of the amplifier, the tuning network comprising at least one tunable capacitor, wherein the at least one tunable capacitor comprises at least one micro-electro mechanical system (MEMS) capacitor;
wherein:
the amplifier comprises a first die;
the at least one MEMS capacitor comprises a second die; and
the first die and the second die are integrated in a single package;
wherein the amplifier comprises an outphasing amplifier including multiple amplifier sections each feeding a respective inductor, the respective inductors feeding the at least one MEMS capacitor.

3. A method comprising:
amplifying an input signal and generating an output signal using an amplifier; and
tuning frequency response of the amplifier using a tuning network coupled to the amplifier, the tuning network comprising at least one tunable capacitor, the at least one tunable capacitor comprising a micro-electro mechanical system (MEMS) capacitor;

wherein:

the amplifier comprises a first die;

the at least one MEMS capacitor comprises a second die; and the first die and the second die are integrated in a single package;

wherein the at least one MEMS capacitor comprises multiple MEMS capacitors disposed along multiple sides of the amplifier.

4. A method comprising:

amplifying an input signal and generating an output signal using an amplifier; and tuning frequency response of the amplifier using a tuning network coupled to the amplifier, the tuning network comprising at least one tunable capacitor, the at least one tunable capacitor comprising a micro-electro mechanical system (MEMS) capacitor;

wherein:

the amplifier comprises a first die;

the at least one MEMS capacitor comprises a second die; and the first die and the second die are integrated in a single package;

wherein the amplifier comprises an outphasing amplifier including multiple amplifier sections each feeding a respective inductor, the respective inductors feeding the at least one MEMS capacitor.

5. A system comprising:

an amplifier comprising multiple power amplifiers; and a tuning network comprising (i) multiple inductors each coupled to one of the power amplifiers and (ii) multiple tunable capacitors coupled to the inductors, wherein each said tunable capacitor comprises at least one micro-electro mechanical system (MEMS) capacitor in a package with the amplifier;

wherein each of the tunable capacitors comprises multiple MEMS capacitors coupled in parallel, wherein each of a first and a second capacitor has a larger number of MEMS capacitors coupled in parallel than a third tunable capacitor.

* * * * *